United States Patent
Gilbert et al.

[19]

[11] Patent Number: 5,885,856
[45] Date of Patent: *Mar. 23, 1999

[54] INTEGRATED CIRCUIT HAVING A DUMMY STRUCTURE AND METHOD OF MAKING

[75] Inventors: Percy V. Gilbert; Subramoney Iyer; Bradley P. Smith, all of Austin; Matthew A. Thompson, Round Rock; Kevin Kemp, Dallas, all of Tex.; Rajive Dhar, Lisle, Ill.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 704,481

[22] Filed: Aug. 21, 1996

[51] Int. Cl.⁶ .............................. H01L 21/76; H01L 21/70
[52] U.S. Cl. ..................... 438/129; 438/424; 438/692; 364/491
[58] Field of Search ..................................... 438/424, 692, 438/693, 759, 959, 227

[56] References Cited

U.S. PATENT DOCUMENTS

| | | |
|---|---|---|
| 4,949,162 | 8/1990 | Tamaki et al. . |
| 4,980,311 | 12/1990 | Namose ................................. 437/67 |
| 5,278,105 | 1/1994 | Eden et al. . |
| 5,290,396 | 3/1994 | Schoenborn et al. .................... 156/636 |
| 5,350,941 | 9/1994 | Madan ..................................... 257/647 |
| 5,374,583 | 12/1994 | Lur et al. ................................... 437/67 |
| 5,399,389 | 3/1995 | Hieber et al. ............................. 427/579 |
| 5,466,636 | 11/1995 | Cronin et al. ............................ 437/187 |
| 5,498,565 | 3/1996 | Gocho et al. . |

FOREIGN PATENT DOCUMENTS

| | | |
|---|---|---|
| 0 545 263 A2 | 6/1993 | European Pat. Off. . |
| 0 712 156 A2 | 5/1996 | European Pat. Off. . |
| 60-15944 | 1/1985 | Japan . |
| 2580787 | 4/1991 | Japan . |
| 96/15552 | 5/1996 | WIPO . |

OTHER PUBLICATIONS

Wolf, S. "Silicon Processing for the VLSI Era:vol. 2, Process Integration", Lattice Press, 1990, p. 54.

*Primary Examiner*—George Fourson
*Attorney, Agent, or Firm*—Keith E. Witek

[57] ABSTRACT

A pattern of dummy structures (20) is added to the layout pattern of an integrated circuit (10) to equilibrate the polishing rate across the surface of a semiconductor substrate (11). The location of each dummy structure (20) is predetermined so that it does not intersect a well boundary (17) or an active region (21,27), and does not fall under a conductive material such as a layer of polysilicon (22,28) or an interconnect structure (23,29).

20 Claims, 7 Drawing Sheets

INTEGRATED CIRCUIT HAVING A DUMMY STRUCTURE AND METHOD OF MAKING

FIELD OF THE INVENTION

This invention relates generally to integrated circuit fabrication, and more specifically to forming a dummy structure on an integrated circuit.

BACKGROUND OF THE INVENTION

This invention is related to a patent application filed on Apr. 6, 1995, by George Meyer. That patent application was given an application Ser. No. of 08/417,524 and is assigned to the same assignee as the present invention.

This invention relates, in general, to semiconductor devices, and more particularly to semiconductor devices having a planarized trench isolation structure.

Some advanced semiconductor devices employ trench isolation as a method for electrically isolating a semiconductor device from neighboring structures. In short, trench isolation structures are formed by first patterning a masking layer on a semiconductor substrate. A reactive ion etch (RIE) is then used to remove exposed portions of the semiconductor substrate to form trench structures. The trenches are then filled with a non-conductive material such as silicon dioxide. Before the formation of the semiconductor device can continue, the non-conductive material must be polished to planarize the surface of the semiconductor substrate while maintaining a filled trench structure.

The density of the trench structures, however, causes a dishing problem when conventional polishing techniques such as chemical and mechanical polishing (CMP) are used. As the density of the trench pattern increases, the polish rate in that area decreases due to the presence of the additional material that must be removed. As a result, isolated trench structures will polish must faster than an area of the substrate that has a higher density of trench structures. This will cause the non-conductive material in the isolated structures to polish further than the denser areas thereby resulting in polishing non-uniformity (referred to as "dishing").

One method used to correct for the dishing problem is to first etch the conductive material with a reactive ion etch (RIE) using a pattern that is the n-layer or opposite pattern used to originally form the trenches. Thus the bulk of the non-conductive material is removed with the RIE etch prior to the polish process. This n-layer technique, however, requires and additional photolithographic mask and processing step and is prone to forming particle defects that will reduce the yield of the semiconductor device.

Another technique that attempts to improve the planarity of the non-conductive layer is to form dummy or tile structures around the device. This is done by simply inserting dummy structures randomly through the device in an attempt to equalize the polishing rate across the substrate. This technique, however, can cause shorting between various well structures or between interconnect structures that are used to form the device. This method can also affect the performance of the device by inserting large structures that change the capacitance of the device.

By now it should be appreciated that it would be advantageous to provide a method for improving the planarization of a non-conductive material when trench isolation is employed. It would also be advantageous if the method did not require the use of an additional photolithographic mask or electrically short circuit conductive portions of a semiconductor device.

DETAILED DESCRIPTION OF THE DRAWINGS

In general, the present invention provides a method for determining the location of dummy mesa structures that are used to equilibrate the polish rate of the surface of a semiconductor substrate. Using the process described below, dummy structures are no longer limited to the periphery of an integrated circuit. It is possible to place dummy structures such that they are in and around the active devices of an integrated circuit. Without the dummy mesa structures, a CMP polish would leave the semiconductor substrate uneven due to the varying polish rates across the surface. The present invention considers the photolithographic patterns used to define the well, active, and conductive regions of a semiconductor device, and then inserts a dummy structure pattern in the portions of an integrated circuit where there are no active devices. This ensures that the dummy structures do not cause electrical shorting across well boundaries or between neighboring structures.

The present invention also addresses performance issues of the integrated circuit by taking into account the parasitic capacitance that the dummy structures introduce into the integrated circuit. The present invention is able to address these issues without adding additional photolithographic masks because the layout geometries used to form an integrated circuit are manipulated prior to generating any of the photolithographic masks.

The invention can be further understood with reference to FIGS. 1–7.

Figure 1:
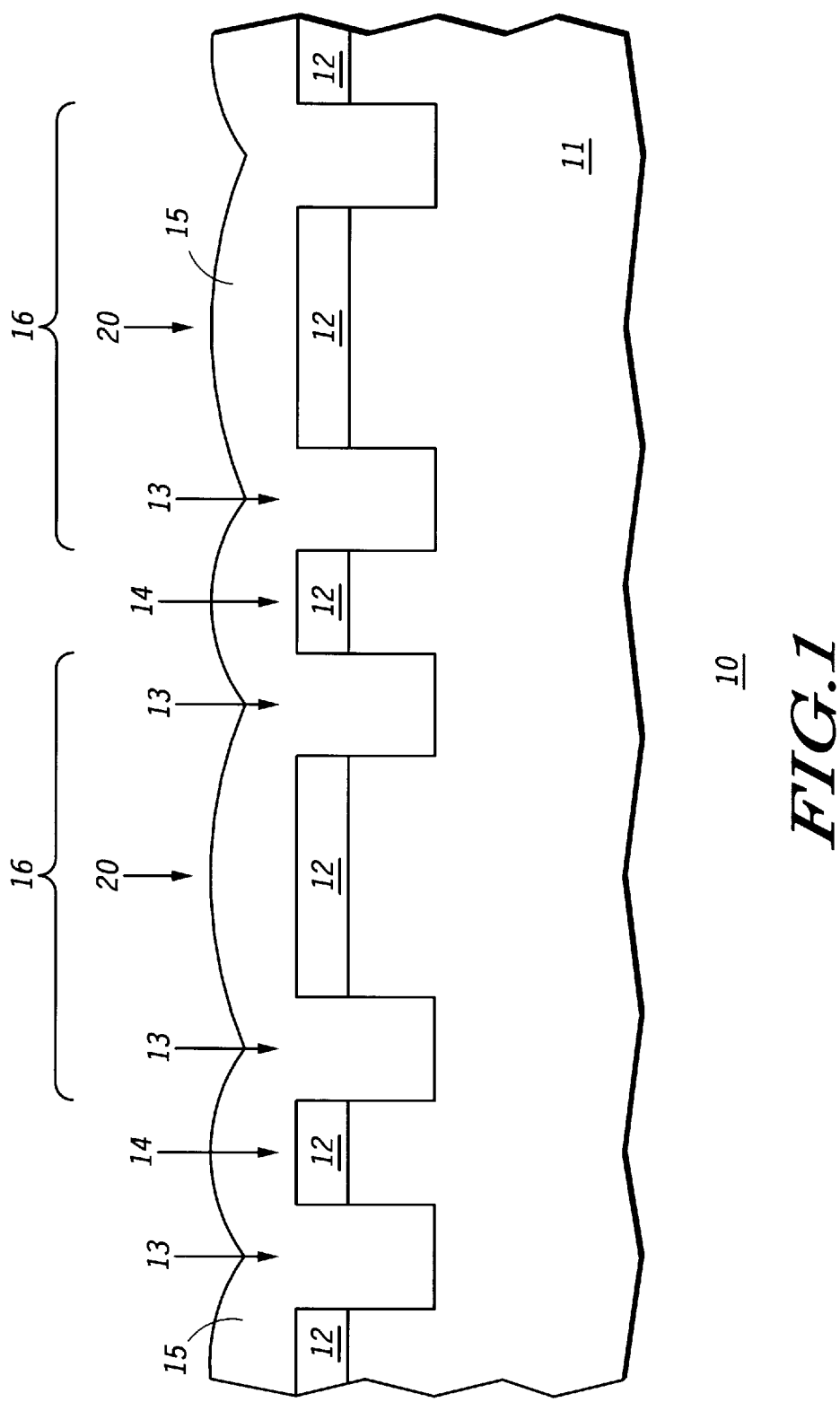
FIG. 1 is an enlarged cross-sectional view of a portion of an integrated circuit in accordance with the present invention.

In FIG. 1, a more detailed description of the present invention is provided. FIG. 1 is an enlarged cross-sectional view of a portion of an integrated circuit 10 that is formed on a semiconductor substrate 11. Electrical isolation between various components of integrated circuit 10 is provided using trench isolation structures. To form the trench isolation structures a mechanical polish or chemical and mechanical polish (CMP) process is commonly used. As shown in FIG. 1, active areas of integrated circuit 10 are provided by mesa structures 14, which are defined by trench structures 13. To form trench structures 13, a masking layer 12, such as silicon nitride, is formed on the surface of semiconductor substrate 11. A photolithographic pattern is then formed on masking layer 12, and a reactive ion etch (RIE) is used to form trench structures 13 using the photolithographic pattern as an RIE etch mask. Trench structures 13 are then filled with a non-conductive material 15, such as silicon dioxide or tetraethylorthosilicate (TEOS) glass, to provide the necessary electrical isolation within the trenches 13.

A polishing process is then used to remove the excess portions of non-conductive material 15 which overlie a top opening of the trenches. This polishing provides a planar surface level with a top portion of the layer 12 in FIG. 1. In conventional integrated circuits, the spacing between neighboring mesa structures can vary and be quite large at times. As a result, the density of the non-conductive material that must be removed will vary across the substrate. The variation in density will result in a variation is polish rates at different points on the semiconductor wafer, which will cause the substrate to have an uneven surface after the polishing process is complete.

The present invention addresses this uniformity problem by forming a pattern of dummy structures in the portion of integrated circuit 10 where there are no active devices. Dummy structures 20 is will fill in the large spaces, indicated by brackets 16 in FIG. 1, that may be present between adjacent mesa structures 14. Care must be taken in determining the proper size and location of dummy structures 20. If placed indiscriminately, dummy structures 20 could short adjacent well regions (not shown) of integrated circuit 10. In addition, the substitution of dummy structures 20 for the non-conductive material 15 that would have been formed in conventional devices, could affect the capacitive loading of integrated circuit 10. This in turn, may degrade the performance of integrated circuit 10.

Figure 2:
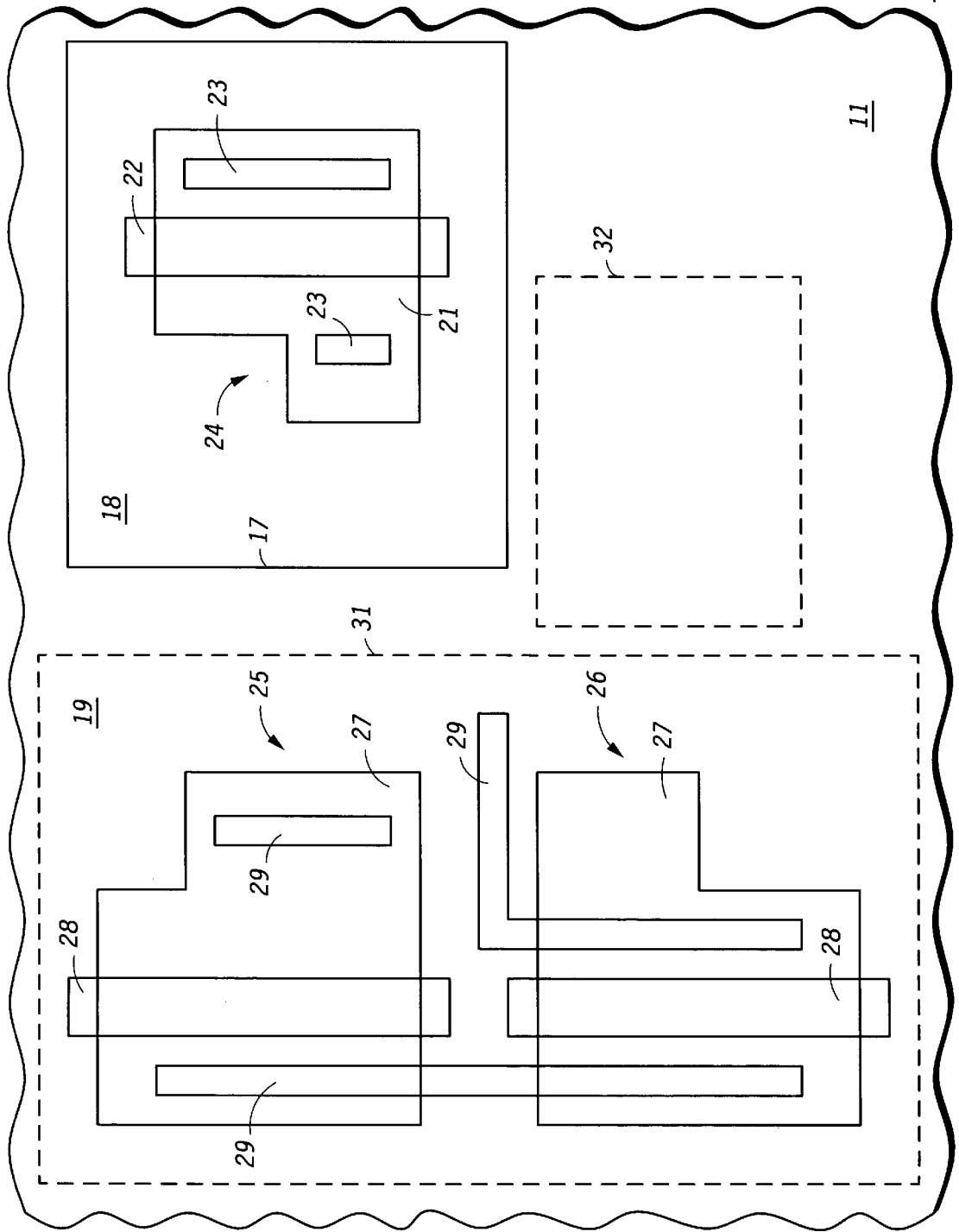
FIG. 2 is an enlarged plane view of a portion of the integrated circuit.

Turning now to FIG. 2, a method for determining the location of dummy structures 20 is now illustrated. FIG. 2 is a top-perspective view of a portion of integrated circuit 10, and is intended to illustrate the portions of integrated circuit 10 that are appropriate to form dummy structures 20. Integrated circuit 10 comprises a p-type device 24 and two n-type devices 25 and 26. It should be understood that the present invention is also applicable to other semiconductor devices such as capacitor structures, resistor structures, diodes, memory cells, bipolar devices, and the like.

P-type device 24 is formed in a n-type well region 18 that has a well boundary 17. Well boundary 17 separates well region 18 from a p-type well region 19 that is used for n-type devices 25 and 26. In the preferred embodiment, substrate 11 is made from p-type material to provide at least some doping atoms for the p-type well region 19. P-type device 24 has an active region 21 with overlying conductive layers that are used to form a gate structure or provide the necessary electrical connections. The gate structure of p-type device 24 is formed with a layer of polysilicon 22 and the electrical connections to contacts or neighboring devices is provided with interconnect structures or contacts 23. The use of interconnect structures 23 are openings through overlying dielectric material which are used to electrically connect source and drain electrodes. Metal or polysilicon (either layer 22 or an additional polysilicon layer) may be used to form the conductive material that fills the openings 23. N-type devices 25 and 26 also have an active region 27 and overlying conductive layers such as a layer of polysilicon 28 and interconnect structures 29.

A first dashed box is used to indicate a first region 31 of integrated circuit 10 that comprises electrically active devices, namely N-type devices 25 and 26. A second dashed box is used to define a second region 32 of the substrate 11 that is absent of electrically active devices. Due to the difference in pattern density of second region 32 compared to first region 31, first region 31 will have a slower polish rate than the structures in second region 32. In previously known polishing processes, the structures in second region 32 would have to be exposed to a longer polish in order to remove all the excess non-conductive material that would exist in first region 31. This would cause a 'dishing' phenomenon and cause the structures in second region 32 to be over polished.

The present invention, however, forms a pattern of dummy mesa structures in second region 32 so that the polish rate of second region 32 can be adjusted to be approximately equal to the polish rate of first region 31 whereby dishing is avoided. Dummy mesa structures will equilibrate the polish rate across semiconductor substrate 11 and result in a surface that has improved planarity when compared to the above mentioned, previously known polish processes.

The method for determining the appropriate locations of dummy structures 20 requires manipulation of the layout patterns that are used to define the various structures of integrated circuit 10. These patterns are generally computer generated with layout programs and are transferred to semiconductor substrate 11 using photolithographic masks. After determining the proper size and location of dummy structures 20, this information is incorporated into the already-required photolithographic masks that are used to form integrated circuit 10, so that no additional masks or photolithographic process steps are required to make the dummy structures.

Figure 3:
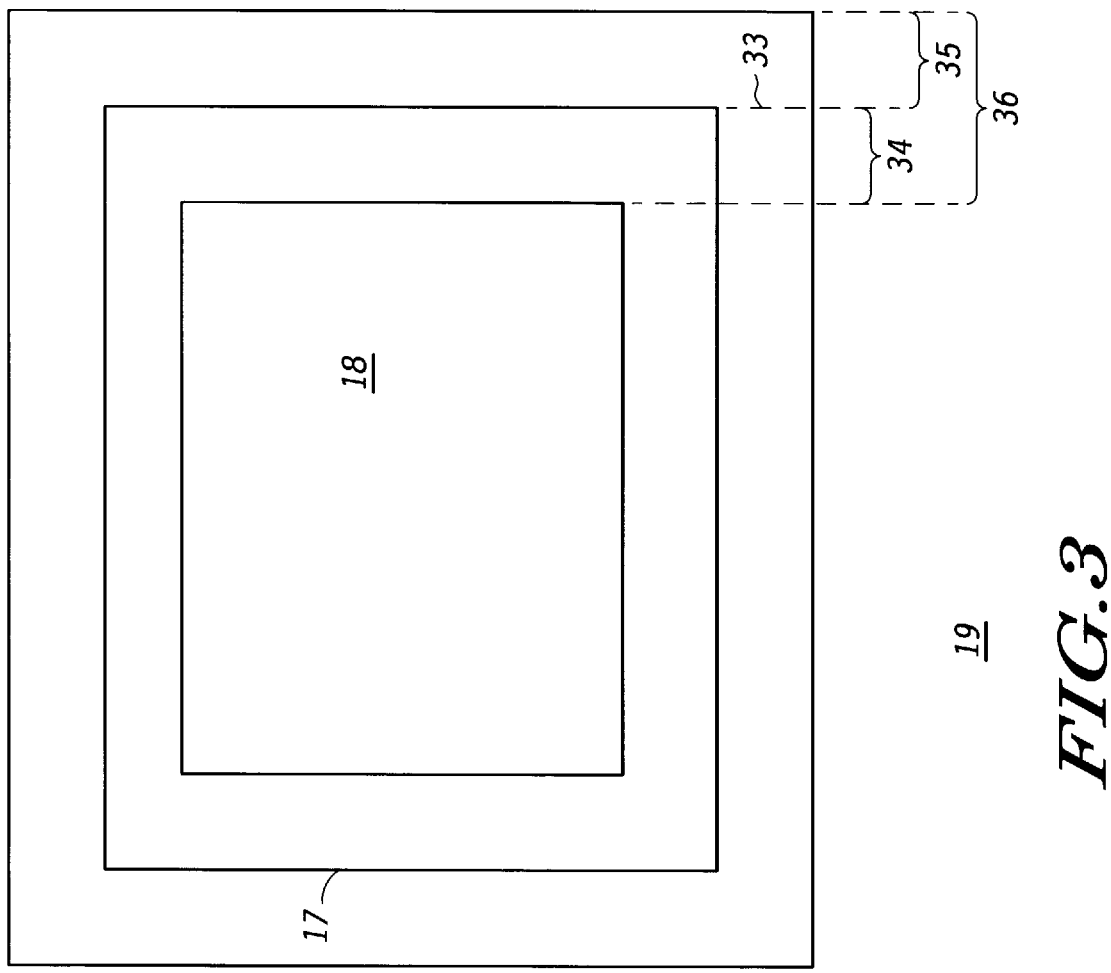
FIGS. 3–7 are enlarged plane views of photolithographic patterns at various stages of the method provided by the present invention.

The method of the present invention begins by first ensuring that none of the dummy structures 20 intersect or come in contact with well boundary 17. It is important that dummy structures 20 do not intersect or cross well boundaries and cause shorting between wells, such as between n-type well region 18 and p-type well region 19 of FIG. 2. In order to accomplish this, a first boundary or a first boundary region 33 is defined around well boundary 17 as is shown in FIG. 3. Using the computer generated pattern for well boundary 17, first boundary region 33 is generated such that region 33 has a first distance 35 which is greater than well boundary 17 and a second distance 34 less than well boundary 17 to provide first boundary region 33 with a total distance 36. Therefore, region 33 is a "hollow" rectangle having a width of dimension 36.

First distance 35 and second distance 34 are generally determined by the latch-up guidelines of the technology used to manufacture integrated circuit 10. For example, first distance 35 and second distance 34 are each at least about 0.75 microns and is preferably about 1 micron to 3 microns for most doping concentrations for modern integrated circuits. First distance 35 corresponds to the distance that first boundary region 33 extends toward p-type well region 19, and second distance 34 corresponds to the distance that first boundary region 33 extends into n-type well region 18. Note, the formation of first boundary region 33 may result in some of the small patterns of well boundary 17 from being removed altogether. This is not a problem since it only insures that dummy structures 20 do not intersect even the smallest of well regions. First boundary region 33 defines the area within integrated circuit 10 where dummy structures 20 are not to be located.

Figure 4:
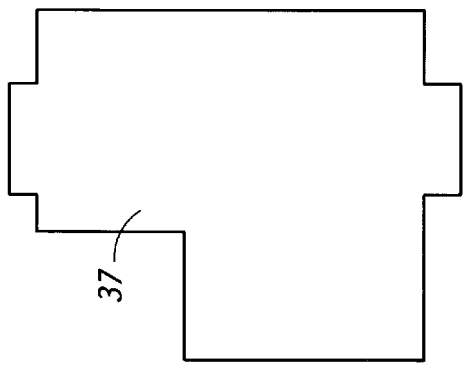
Figure 4:
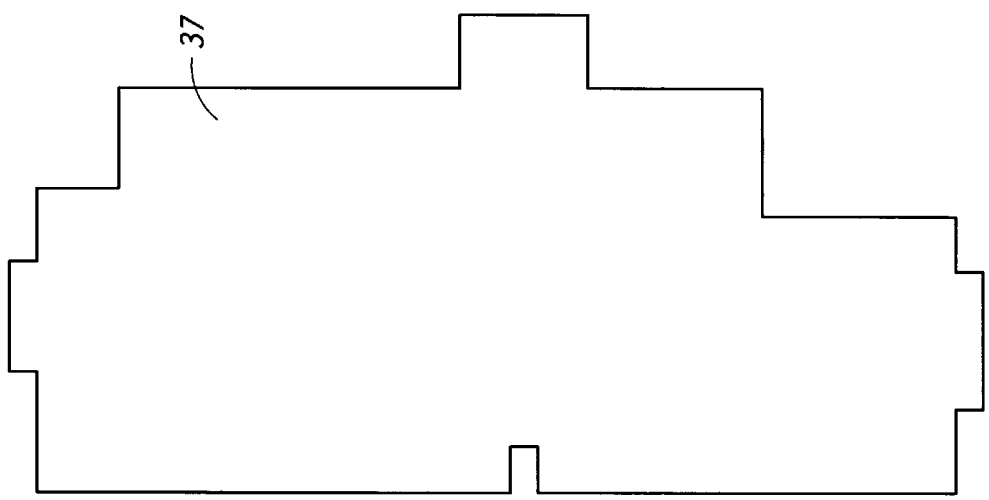

Referring now to FIG. 4, the capacitive loading of integrated circuit 10 could be increased if dummy structures 20 were formed under conductive layers, such as polysilicon or aluminum, used to form integrated circuit 10. To prevent increased capacitive coupling, a merged region 37 is defined by merging the layout patterns that define the active regions and the conductive regions of integrated circuit 10. This region can then be optionally oversized to account for any processing limitations or photolithographic capabilities to form a second boundary region where dummy structures 20 will not be formed.

Merged regions 37, as shown in FIG. 4, are created by combining the patterns shown in FIG. 1 that provide active area 21, active areas 27, polysilicon layers 22 and 28, and interconnect structures 23 and 29. Merged regions 37, are then oversized by about 0.5 microns to 5 microns (as capacitive reduction warrants) to provide the pattern shown in FIG. 4. This will prevent dummy structures 20 from intersecting any conductive structures in integrated circuit 10. The present invention will also prevent dummy structures 20 from being under or overlapped by any conductive material that might affect the performance of integrated circuit 10. It should also be understood that it would be equivalent to form one boundary around active areas 21 and 27, form a second boundary around polysilicon layers 22 and 28 and interconnect structures 23 and 29, and then merge those two patterns together to form merged regions 37. During the process used to define merged regions 37, it is possible that two or more boundary regions overlap each other. In this case, the entire overlapped region is considered inappropriate for the formation of dummy structures 20.

Figure 5:
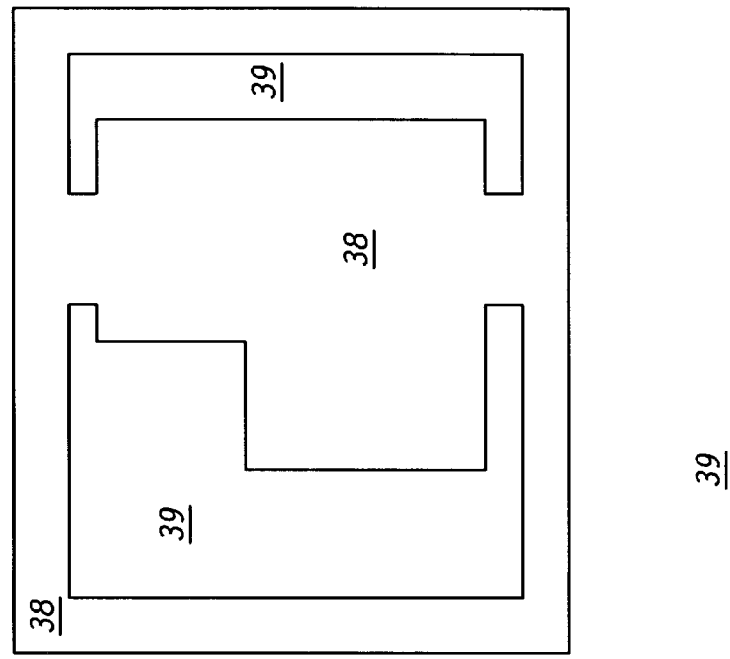
Figure 5:
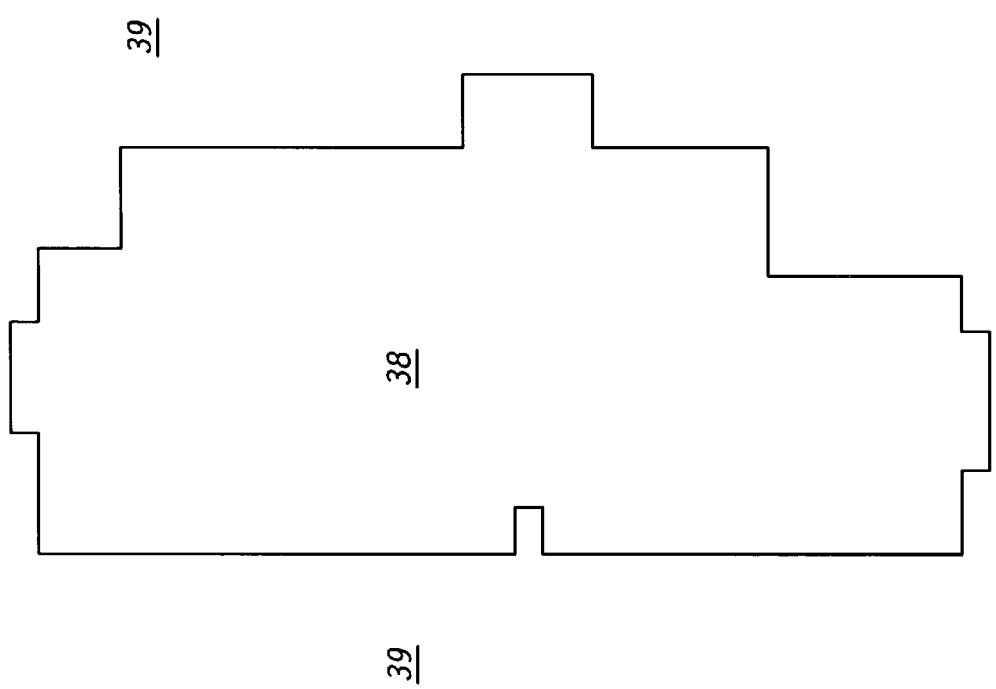

Turning now to FIG. 5, the method of the present invention continues by defining or creating restricted regions 38. Restricted regions 38 are defined as the areas of integrated circuit 10 where dummy structures 20 are not to be formed. Restricted regions 38 are formed by overlapping the merged regions 37 of FIG. 4 with the first boundary region 33 of FIG. 3. Any overlap of a merged region 37 with a first boundary region 33 is included as part of restricted regions 38. Any portion of integrated circuit 10 that is not included in restricted regions 38 is an area 39 where the dummy structure pattern may be formed.

Figure 6:
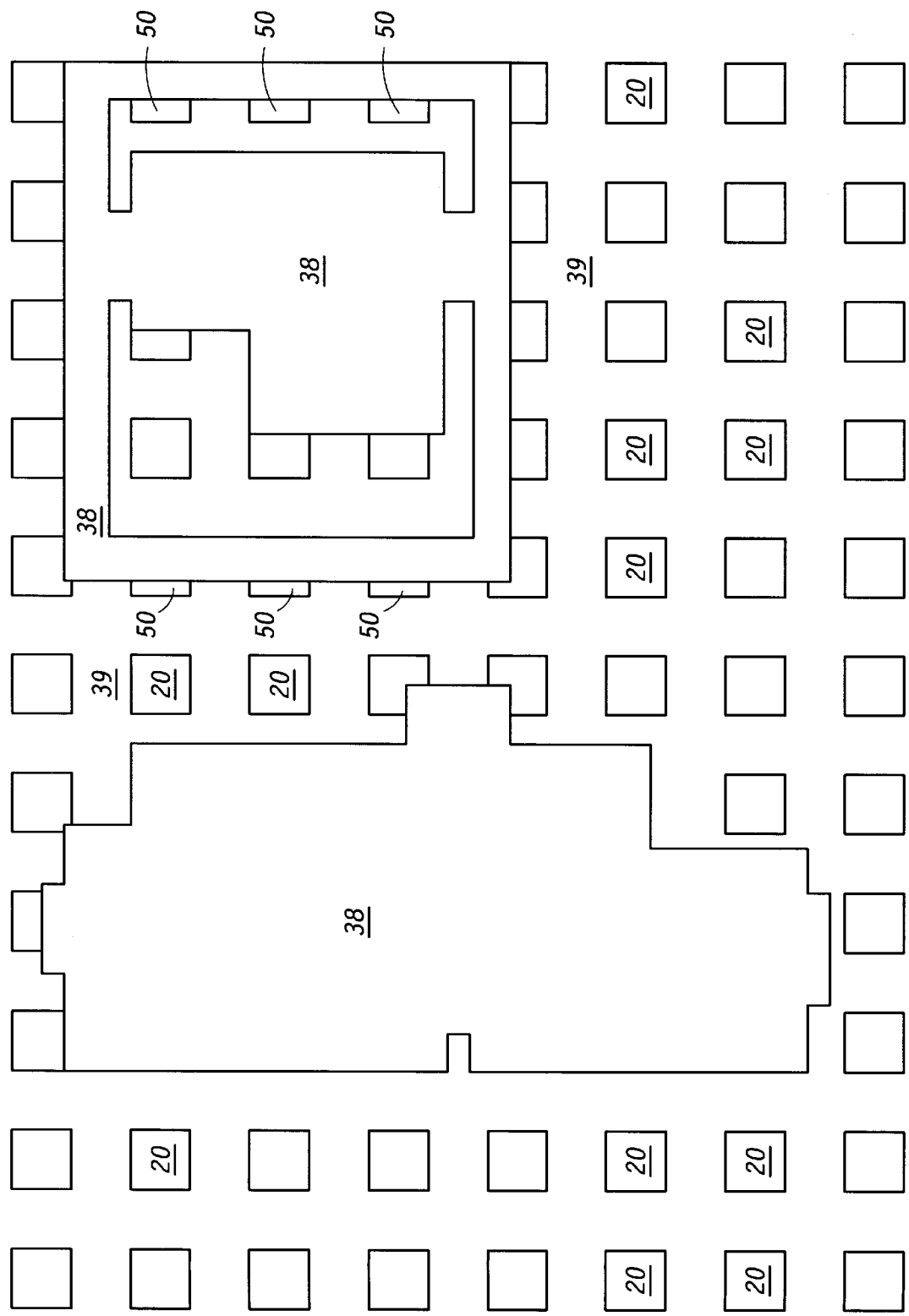

A pattern of dummy structures 20 is laid over the restricted regions 38 of FIG. 5 to provide the pattern shown in FIG. 6. The pattern comprises a repeating pattern of dummy structures 20 and dummy structures 50. Dummy structures 50 are dummy structures that have dimensions that are too small to be formed by the technology used to form integrated circuit 10 and will be removed from the pattern of dummy structures 20 as will be described shortly.

The repeating pattern of dummy structures 20 has a fill density that is defined as the ratio of area 39 that is covered with dummy structures 20 compared to the total surface area of area 39. This density can be adjusted to closely match the density of the structures that are in restricted region 38 of FIG. 5 so that the entire surface of semiconductor substrate 11 can have as even of a polish rate as possible. Preferably, the density of the repeating pattern is about 5 percent to 40 percent and each dummy structure 20 is evenly spaced from each other. It is also possible that dummy structures 20 are randomly distributed throughout area 39 to adjust the density of dummy structures 20 across semiconductor substrate 11. As shown, dummy structures 20 are rectangular in shape. It should also be understood, however, that the shape of each dummy structure 20 can vary and can even have the shape of a structure used to form integrated circuit 10.

Figure 7:
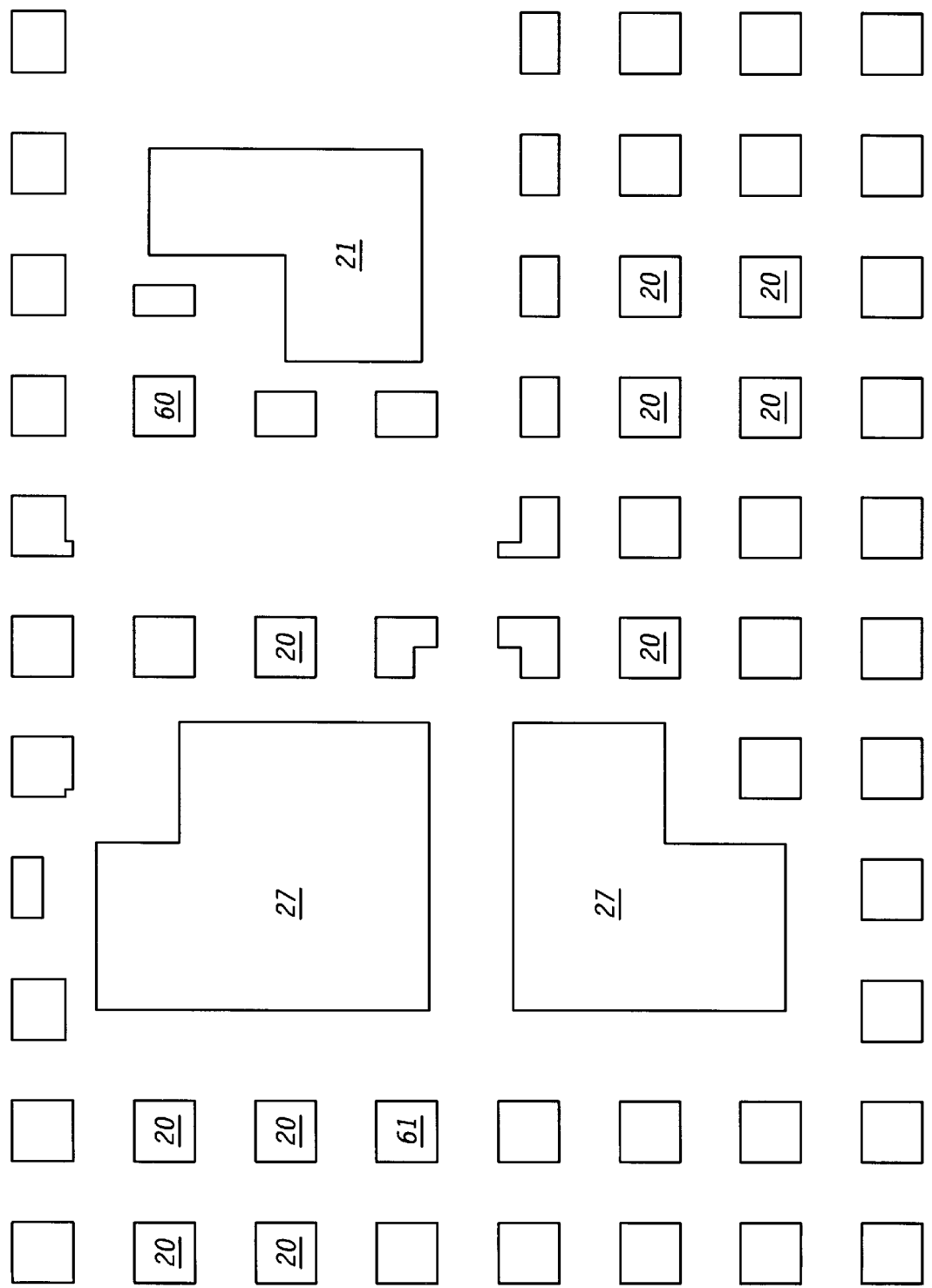

Once the location of dummy structures 20 has been determined, their use is incorporated into the manufacturing process of integrated circuit 10 by adding the pattern of dummy structures 20 to the photolithographic mask that is used to define the active areas 21 and 27 of integrated circuit 10. Such a pattern is shown in FIG. 7. FIG. 7 shows the pattern that would be used to form a portion of integrated circuit 10 shown in FIG. 2. The pattern of FIG. 7 would be transferred to a photolithographic mask and used to define the active areas of integrated circuit 10 such as the mesa structures 14 shown in FIG. 1. In addition, this pattern includes the structures to form dummy structures 20 as shown in FIG. 1. Therefore, the pattern of dummy structures 20 can be incorporated into a manufacturing flow by modifying a photolithographic mask rather than having to add an addition photolithographic mask. It is also possible to integrate the pattern of dummy structures 20 such that instead of being formed in semiconductor substrate 11, they are formed on substrate 11 such as a pattern of field oxide structures.

The rest of integrated circuit 10 can be formed using conventional techniques. In such techniques, it is common for portions of the photolithographic pattern used to define the location of active areas (i.e. active areas 21 and 27) to also be used to provide a pattern for implanting the semiconductor substrate with dopants. For example, the pattern that defines active region 21 would be copied to create an additional photolithographic mask that could be used so that only the portions of p-type device 24 that are in well region 18 would be doped with a particular species. On this photolithographic mask, the portions of the pattern that define active areas 27 would be omitted so that these areas would not be doped when active area 21 is implanted.

The present invention would mimic this technique except dummy structures 20 that are in each well region would not be included in the photolithographic pattern used to implant the active regions. Instead, the pattern of the dummy structures 20 that are in well region 19 would be included in the pattern of the photolithographic mask that is used to implant active region 21. In similar fashion, the dummy structures 20 that are in well region 18 would be included in the photolithographic pattern that would be used to implant active regions 27. As a result, each dummy structure 20 would be doped with a species of the opposite conductivity than the conductivity of the well region that it resides in.

This will form each dummy structure into an isolated diode and further reduce the capacitive loading effects each dummy structure 20 will have on integrated circuit 10. For example, dummy structure 60 in FIG. 7, which is in n-type well region 18, would be included in the photolithographic pattern used to dope active regions 27, and thus would be implanted with a p-type dopant when active regions 27 are formed. In addition, dummy structure 61 in FIG. 7, which is in p-type well region 19, would be included in the photolithographic pattern used to dope active regions 27 and thus would be implanted with a n-type dopant when active region 27 is formed. Thus, dummy structures 60 and 61 will form floating diodes.

By now it should be appreciated that the present invention provides a structure and a methodology for forming the structure that will improve the planarization of a polish process. The method considers the photolithographic patterns to be used to form an integrated circuit to determine the locations of dummy mesa structures. The pattern to form the dummy mesa is included within the photolithographic masks that are used to form the integrated circuit. Therefore, the present invention can improve the planarization of a polishing process without any additional manufacturing cost.

We claim:

1. A method of determining a location of a dummy structure pattern within a layout for an integrated circuit to enable manufacture of the integrated circuit, wherein the integrated circuit is defined in a computer file and has a pattern that defines a well boundary, a pattern that defines an active region, and a pattern that defines a conductive layer, the method comprising the steps of:

defining, via a computer, a first border region around the pattern that defines the well boundary, the first border region being an area outside a concentric inner periphery that lies within the well boundary and inside a concentric outer periphery that lies around an outside of the well boundary;

merging, via the computer, the pattern that defines the active region with the pattern that defines the conductive layer to provide a merged pattern;

defining, via the computer, a second border region around an outer periphery of the merged pattern to form a larger area merged pattern; and defining, via the computer, the dummy structure pattern within the integrated circuit such that the dummy structure pattern does not lay within the first border region or the larger area merged pattern, the dummy structure pattern defining trenches and mesas so that capacitive coupling between the conductive layer and the dummy structure pattern is reduced.

2. The method of claim 1 wherein the well boundary separates a p-type region from a n-type region and the step of defining the first border region includes defining the first border region such that the first border region extends a first distance into the p-type region to define one of either the concentric inner periphery or the concentric outer periphery and a second distance into the n-type region to define a remaining of either the concentric inner periphery or the concentric outer periphery.

3. The method of claim 2 wherein the first distance and the second distance are about 1 micron to 3 microns.

4. The method of claim 1 wherein the pattern that defines the conductive layer defines a layer of polysilicon that provides a gate structure for a transistor in the integrated circuit.

5. The method of claim 4 wherein the integrated circuit comprises a pattern that defines an interconnect structure coupled to a source/drain region of a transistor and the step of merging the pattern of the active region with the pattern of the conductive layer includes the additional step of also merging the pattern of the interconnect structure to provide the merged pattern.

6. The method of claim 1 wherein the dummy structure pattern comprises a repeating pattern of high surface topography structures that are equally spaced from each other by low surface topography structures.

7. The method of claim 6 wherein each structure of the repeating pattern of structures is a pillar-like mesa portion of substrate material within the integrated circuit where the pillar-like mesa portions are entirely surrounded and separated from each other by a trench portion.

8. The method of claim 6 wherein the repeating pattern of structures covers an area where the repeating pattern of structures provides a fill density of the area that is about 5 percent to 40 percent whereby 5 percent to 40 percent of the area is covered by the repeating structures.

9. A method of forming an integrated circuit on a semiconductor substrate, wherein the integrated circuit comprises a well region which is a portion of the substrate doped to an opposite conductivity of a conductivity type of the semiconductor substrate, an active region which is a portion of the semiconductor substrate in which at least one transistor is formed, and a conductive layer overlying the substrate where the conductive layer couples to the transistor, the method comprises the step of:

defining the well region, the active region, and the conductive layer in two-dimensional space in a computer;

defining, via the computer, a first prevention region around an outer circumference of the well region;

defining, via the computer, a second prevention region around the combination of the active region and the conductive layer;

expanding, via the computer, an area covered by the second prevention region to form a third prevention region;

combining, via the computer, the first prevention region and the third prevention region to obtain a collective prevention region;

defining trench structures in the computer which define dummy mesa structures that lay completely outside the collective prevention region so that the dummy mesa structures do not intersect the well region and are spaced apart from the conductive layer and the active area;

manufacturing a plurality of integrated circuits having the well region, the active area, and the conductive layer formed in accordance with lithographic masks that are formed in accordance with the collective prevention region defined by the computer.

10. The method of claim 9 wherein the first prevention region is determined by forming a first pattern within the well region that lies completely within the outer edge of the well region, and a second pattern lying completely outside of the well region and surrounding the well region, wherein no dummy mesa structures are placed within a region directly outside of the first pattern and directly inside of the second pattern.

11. The method of claim 10 wherein the second prevention region is determined by forming a third pattern around the active region and fourth pattern around the conductive layer and merging the two patterns to form a fifth pattern.

12. The method of claim 11 wherein the dummy mesa structures are located on the semiconductor substrate by merging the area defined by the first and second pattern with an area defined by the fifth pattern to form the collective prevention region, wherein the computer places the dummy mesa structures such that they are excluded from the collective prevention region.

13. The method of claim 12 wherein the integrated circuit comprises an n-type well region and a portion of the dummy mesa structures are formed in the n-type well region, and the method further comprises the step of doping the portion of the dummy mesa structures with a p-type dopant to form diodes.

14. A method for forming an integrated circuit on a semiconductor substrate, wherein the semiconductor substrate has a first region comprising an electrically active device defined by at least one conductive layer over a substrate, an active region, and a well region and a second region that is absent any electrically active device, the method comprising the steps of:

defining, via a computer, a first exclusion region around a periphery of the well region, a second exclusion region around a periphery of the conductive layer, and a third exclusion region around a periphery of the active area;

merging, via the computer, all of the first, second, and third exclusion region into a composite exclusion region, the composite exclusion region including portions of the first region comprising electrically active devices and comprising portions of the second region that is absent any electrically active device;

defining, via the computer, a dummy structure only within areas outside of the composite exclusion region; and forming the dummy structures onto an integrated circuit substrate in accordance with the steps performed by the computer.

15. The method of claim 14 wherein the dummy structure is a mesa structure formed in the semiconductor substrate where the mesa structure is surrounded by a contiguous trench region.

16. The method of claim 15 wherein the first exclusion region has an inner periphery and outer periphery wherein each of the inner periphery and the outer periphery is at least about 0.75 microns from the periphery of the well region.

17. The method of claim 15 wherein the second exclusion region is expanded to an area that is greater than a area covered by the area defined by a periphery of the conductive layer.

18. The method of claim 17 wherein the second exclusion region is created to reduce capacitive coupling between the conductive layer and any mesas formed in the dummy structure.

19. The method of claim 17 wherein the electrically active device of the first region comprises a conductive layer that interconnects to a source/drain electrode of the electrically active device.

20. The method of claim 19 wherein the conductive layer is used to form a gate structure of the electrically active device and the conductive layer is formed without overlying the dummy structure to reduce capacitive coupling.

* * * * *